(12) United States Patent
Matsushita et al.

(10) Patent No.: US 11,791,164 B2
(45) Date of Patent: Oct. 17, 2023

(54) POLISHING COMPOSITION AND POLISHING METHOD

(71) Applicant: NITTA HAAS INCORPORATED, Osaka (JP)

(72) Inventors: Takayuki Matsushita, Kyoto (JP); Tomoki Yamasaki, Kyoto (JP)

(73) Assignee: NITTA DUPONT INCORPORATED, Osaka (JP)

( * ) Notice: Subject to any disclaimer, the term of this patent is extended or adjusted under 35 U.S.C. 154(b) by 0 days.

(21) Appl. No.: 15/129,838

(22) PCT Filed: Mar. 30, 2015

(86) PCT No.: PCT/JP2015/059924
§ 371 (c)(1),
(2) Date: Sep. 28, 2016

(87) PCT Pub. No.: WO2015/152151
PCT Pub. Date: Oct. 8, 2015

(65) Prior Publication Data
US 2017/0178926 A1   Jun. 22, 2017

(30) Foreign Application Priority Data
Mar. 31, 2014   (JP) .................. 2014-073790

(51) Int. Cl.
*H01L 21/321* (2006.01)
*C09G 1/02* (2006.01)
(Continued)

(52) U.S. Cl.
CPC ............ *H01L 21/3212* (2013.01); *C09G 1/02* (2013.01); *H01L 21/02024* (2013.01); *H01L 21/31053* (2013.01)

(58) Field of Classification Search
None
See application file for complete search history.

(56) References Cited

U.S. PATENT DOCUMENTS 6,340,374 B1   1/2002   Kato et al.
6,551,367 B2   4/2003   Lee et al.
(Continued)

FOREIGN PATENT DOCUMENTS

CN   101511532   8/2009
CN   102585705   7/2012
(Continued)

OTHER PUBLICATIONS

David Fairhurst, Ph.D. Powder Surface are Comparison BET and ACORN Area, Mar. 12, 2007. https://www.xigonanotools.com/wp-content/uploads/2015/12/XiGo-Note-101-Powder-Surface-Area-Comparison-BET-and-Acorn-Area.pdf (Year: 2007).*

(Continued)

*Primary Examiner* — Allan W. Olsen
(74) *Attorney, Agent, or Firm* — Clark & Brody LP

(57) ABSTRACT

The present invention relates to a polishing composition including water and silica, wherein the silica has a BET specific surface area of 30 m²/g or more and an NMR specific surface area of 10 m²/g or more, and a polishing method using the polishing composition. The polishing composition of the present invention adopts silica having the BET specific surface area falling within the above-described range, and additionally having the NMR specific surface area falling within a specific range, and consequently attains a high polishing rate, and can maintain the polishing rate even when used for a long time.

11 Claims, 1 Drawing Sheet

(51) Int. Cl.
*H01L 21/02* (2006.01)
*H01L 21/3105* (2006.01)

(56) References Cited

U.S. PATENT DOCUMENTS

| | | | |
|---|---|---|---|
| 9,283,648 B2 | 3/2016 | Long et al. | |
| 9,446,493 B2 | 9/2016 | Long et al. | |
| 2001/0034979 A1 | 11/2001 | Lee et al. | |
| 2003/0061766 A1* | 4/2003 | Vogt | C09G 1/02 |
| | | | 51/308 |
| 2004/0092103 A1 | 5/2004 | Fujii et al. | |
| 2006/0196849 A1 | 9/2006 | Moeggenborg et al. | |
| 2008/0141904 A1 | 6/2008 | Barthel et al. | |
| 2008/0237535 A1* | 10/2008 | Maejima | C09G 1/02 |
| | | | 252/79.1 |
| 2010/0069237 A1* | 3/2010 | Yano | B01J 20/103 |
| | | | 502/439 |
| 2010/0152514 A1* | 6/2010 | Vaughn | B01J 29/061 |
| | | | 585/640 |
| 2010/0163786 A1* | 7/2010 | Izumi | C09G 1/02 |
| | | | 252/79.1 |
| 2014/0057532 A1 | 2/2014 | Long et al. | |
| 2014/0057533 A1 | 2/2014 | Long et al. | |
| 2014/0302753 A1 | 10/2014 | Morinaga et al. | |
| 2015/0053642 A1* | 2/2015 | Bulick | H01L 21/0242 |
| | | | 216/38 |
| 2015/0123027 A1 | 5/2015 | Sakaida et al. | |
| 2015/0210891 A1 | 7/2015 | Tsuchiya et al. | |
| 2015/0299517 A1* | 10/2015 | Matsushita | C09K 3/1409 |
| | | | 252/79.1 |
| 2016/0002500 A1* | 1/2016 | Ito | C09G 1/00 |
| | | | 252/79.1 |
| 2016/0151876 A1 | 6/2016 | Long et al. | |
| 2017/0204258 A1* | 7/2017 | Teasley | C08L 9/06 |

FOREIGN PATENT DOCUMENTS

| | | | |
|---|---|---|---|
| CN | 104798181 | 7/2015 | |
| JP | 09-296161 | 11/1997 | |
| JP | 2000-345144 | 12/2000 | |
| JP | 2001-089746 | 4/2001 | |
| JP | 2008-529949 | 8/2008 | |
| JP | 2010-028077 | 2/2010 | |
| JP | 2012-526593 | 11/2012 | |
| WO | 2013/069623 | 5/2013 | |
| WO | 2013/176122 | 11/2013 | |
| WO | 2014/030570 | 2/2014 | |
| WO | 2014/032012 | 2/2014 | |
| WO | 2014/084091 | 6/2014 | |
| WO | WO-2015065185 A1 * | 5/2015 | B82Y 40/00 |

OTHER PUBLICATIONS

Marc Fleury; NMR Surface Relaxivity Determination Using NMR Apparent Diffusion Curves and Bet Measurements; International Symposium of the Society of Core Analysts held in Calgary, Canada, Sep. 10-12, 2007. (Year: 2007).*

Lutz Riepe, Specific Internal Surface :The "Forgotten?" Petrophysical Measurement! or Application of Fractal Pore Models for Improved Permeability Estimations From Logs! ; 1998; http://www.jgmaas.com/SCA/1998/SCA1998-40.pdf; 1998 (Year: 1998).*

Takeda, "Memorandum of Ceramic Powder-Surface Characteristics and Wettability", New Ceramics Letter, Dec. 2012, No. 47, p. 3-6.

* cited by examiner

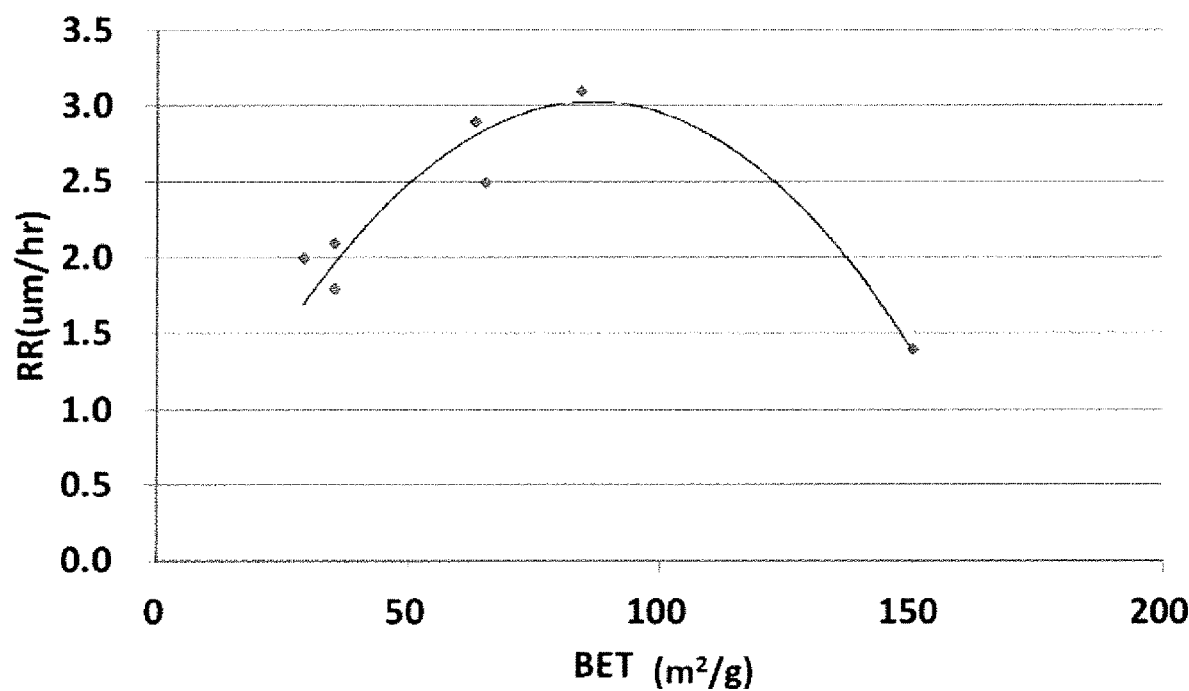

POLISHING COMPOSITION AND POLISHING METHOD

CROSS-REFERENCE TO RELATED APPLICATION

This application claims priority to Japanese Patent Application No. 2014-73790, the content of which is incorporated herein by reference.

BACKGROUND OF THE INVENTION

Field of the Invention

The present invention relates to a polishing composition and a polishing method using the same.

Background Art

Recently, materials referred to as hard-brittle materials such as sapphire, silicon carbide and silicon nitride have been used in substrates for LEDs and substrates for power devices.

When a substrate using such a hard-brittle material (hereinafter, also referred to as a hard-brittle material substrate) is polished, a polishing composition enhanced in mechanical polishing force by using an abrasive grain having a large grain size in order to improve the polishing rate is sometimes used because the hardness of the substrate is relatively high. However, an abrasive grain having a large grain size has a smaller surface area (specific surface area) in relation to the abrasive grain mass, as compared with an abrasive grain having a small grain size, and accordingly the proportion of the grain surface degraded by polishing tends to be larger; for example, there is a problem that when a polishing composition is used over a long term in such a way that a polishing composition is repeatedly used, the polishing rate is degraded.

Accordingly, various investigations have been made for the purpose of maintaining the polishing rate over a long term while the polishing rate for hard-brittle material substrate is being improved. For example, Patent Literature 1 describes a polishing composition including silicas having different grain sizes. Such a polishing composition has a high polishing rate for hard-brittle materials, and includes silica having a small grain size; thus, the specific surface area of the abrasive grain is made large, and the polishing with the whole of the abrasive grains provides the suppression effect on the increase in the proportion of the degraded abrasive grain surface; hence, even when the polishing composition is used repeatedly, the polishing rate can be maintained to some extent.

However, there is a problem that even such a polishing composition as described in Patent Literature 1 is insufficient in maintaining a high polishing rate over a long term.

CITATION LIST

Patent Literature

Patent Literature 1; International Publication No. WO 2013/069623

SUMMARY OF THE INVENTION

Technical Problem

Accordingly, in view of such conventional problems as described above, an object of the present invention is to provide a polishing composition capable of maintaining the polishing rate relatively high over a long term.

Another object of the present invention is to provide a polishing method capable of achieving polishing at a relatively high polishing rate and maintaining the polishing rate over a long term.

Solution to Problem

The polishing composition according to the present invention includes water and silica, wherein the silica has a BET specific surface area of 30 $m^2/g$ or more and an NMR specific surface area of 10 $m^2/g$ or more.

The polishing composition according to the present invention may have a pH of 8.0 or more and 11.5 or less.

The polishing method according to the present invention polishes a polishing object using the polishing composition.

According to the polishing method according to the present invention, the polishing composition is recovered after used once or more, and used again to polish a polishing object.

The polishing method according to the present invention polishes a substrate including a hard-brittle material.

BRIEF DESCRIPTION OF THE DRAWINGS

FIG. 1 is a graph showing the relationship between the BET specific surface area and the polishing rate.

DETAILED DESCRIPTION OF THE PREFERRED EMBODIMENT

Hereinafter, the polishing composition and the polishing method according to the present invention are described.

The polishing composition of the present embodiment includes water and silica, wherein the silica has a BET specific surface area of 30 $m^2/g$ or more and an NMR specific surface area of 10 $m^2/g$ or more.

(A) Silica

The polishing composition of the present embodiment includes silica as an abrasive grain.

In the polishing composition, any type of silica usable as an abrasive grain can be used without being particularly limited; examples of such a type of silica include colloidal silica and fumed silica; these can be used each alone or as mixtures of two or more thereof.

Among these, colloidal silica is preferable. When colloidal silica is used as an abrasive grain, the occurrence of the defects such as scratches in a polishing object can be suppressed, and it is thus preferable.

The silica is a silica having a BET specific surface area of 30 $m^2/g$ or more, preferably 35 $m^2/g$ or more and 150 $m^2/g$ or less, more preferably 35 $m^2/g$ or more and 140 $m^2/g$ or less, and having an NMR specific surface area of 10 $m^2/g$ or more, and preferably 13 $m^2/g$ or more and 150 $m^2/g$ or less.

For the polishing composition of the present embodiment, silica having a specific surface area falling within the above-described ranges can be appropriately selected and adopted.

The BET specific surface area is a specific surface area measured by the BET method on the basis of the adsorption amount of $N_2$ gas; specifically, the BET specific surface area can be measured by the method described in the Examples described below. The BET specific surface area is a value measured for silica in dried state.

The NMR specific surface area is a specific surface area obtained by measuring the relaxation time of the liquid in which grains are dispersed with pulse NMR; specifically, the NMR specific surface area can be measured by the method described in the Examples described below. The NMR specific surface area is a value measured for silica in a dispersion liquid.

By setting the BET specific surface area so as to fall within the above-described range, the area of the portion of the silica grains brought into contact with a polishing object can be made large, and accordingly, in general, with the increase in the BET specific surface area, the polishing rate tends to be improved.

On the other hand, the BET specific surface area is a value obtained by measuring the specific surface area of silica in a dried state, and accordingly, the variation of the polishing rate due to the surface state of the silica grains in the polishing composition is not represented by the BET specific surface area. For example, the hydrophilicity of the surface of silica is varied in an alkaline liquid; such a variation of the hydrophilicity varies the amount of the liquid component in the polishing composition adhering to the surface of the silica, and thus varies the polishing performances such as the polishing rate. However, such variations of the polishing performances due to such a variation of the surface of silica are not correlated with the BET specific surface area.

Accordingly, only the value of the BET specific surface area of silica is insufficient as the parameter representing the polishing rate.

The NMR specific surface area is a specific surface area obtained on the basis of the NMR relaxation time of the liquid being in contact with or being adsorbed to the grains in the dispersion liquid and the NMR relaxation time of the liquid not being in contact with or being not adsorbed to the grains; specifically, the NMR specific surface area can be measured by the method described in the Examples described below.

The specific surface area measured by the NMR method is a value obtained by measuring silica in the liquid, and accordingly, with the increase in the hydrophilicity of the surface of silica, the NMR specific surface area also increases. The hydrophilicity of the surface of silica causes a change in the maintenance of the polishing rate at the time of a long-term use of the polishing composition. Specifically, when the hydrophilicity of the surface of silica increases, the surface of silica is activated so as to increase the reactivity to a polishing object, and thus, the degradation of the surface of the grains due to the polishing is suppressed.

On the other hand, for the silica having a BET specific surface area deviating from the above-described range, the correlation between the height of the NMR specific surface area and the maintenance of the polishing rate at the time of long-term use is not obtained.

The polishing composition of the present embodiment adopts silica having a BET specific surface area falling within the above-described range, and further having an NMR specific surface area falling within a specific range: consequently, the polishing composition of the present embodiment attains a high polishing rate, and, at the same time, can maintain the polishing rate even when used over a long term.

The concentration of silica in the polishing composition of the present embodiment is not particularly limited, but is, for example, 5.0% by mass or more and 50% by mass or less, and preferably 10% by mass or more and 45% by mass or less.

When the concentration of silica falls within the above-described range, the polishing rate for a polishing object can be further improved.

(B) pH

The polishing composition of the present embodiment has a pH of 8.0 or more and 11.5 or less, and preferably a pH of 8.5 or more and 11.0 or less.

When the pH range of the polishing composition falls within the above-described range, the polishing rate for a polishing object can be improved, and, at the same time, the dispersibility of silica can also be improved, and it is thus preferable.

The number of the silanol groups on the surface of silica is known to vary in an alkaline liquid, and the number of the silanol groups on the surface of silica affects the polishing rate. Accordingly, when the pH of the polishing composition falls within the above-described range, an appropriate amount of silanol tends to be present on the surface of silica, and it is thus preferable.

Examples of the method to be used for regulating the pH of the polishing composition of the present embodiment so as to fall within the above-described range include, but not particularly limited to, inorganic acids such as hydrochloric acid, sulfuric acid, nitric acid, phosphoric acid, phosphorous acid, boric acid and carbonic acid; carboxylic acids such as acetic acid, oxalic acid and tartaric acid; organic acids such as organic phosphonic acid and organic sulfonic acid; alkali metal hydroxides such as NaOH and KOH; alkaline earth metal hydroxides; inorganic bases such as ammonia; and organic basic compounds such as amines, quaternary ammonium hydroxides such as tetramethyl ammonium hydroxide (TMAH) and salts of quaternary ammonium hydroxides.

The polishing composition of the present embodiment may further include other components.

Examples of the other components include a surfactant and a chelating agent.

The polishing composition of the present embodiment may be prepared as a high concentration liquid having a concentration higher than the desired concentration at the time of use, and may be diluted at the time of use.

When the polishing composition is prepared as such a high concentration liquid, the high concentration liquid is convenient for storage and transportation.

When the polishing composition is prepared as a high concentration liquid, examples of the preparation include preparation in which the high concentration liquid is prepared so as to have a concentration capable of being diluted at the time of use by a factor of more than 1-fold (undiluted liquid) to 10-fold and preferably more than 1 to 5-fold.

(C) Polishing Object

Examples of the polishing object of the polishing composition of the present embodiment include, but not particularly limited to, substrates (hard-brittle material substrates) including hard-brittle materials such as sapphire, silicon nitride, silicon carbide, silicon oxide, glass, gallium nitride, gallium arsenide, indium arsenide and indium phosphide. Such hard-brittle materials are, as compared with silicon wafers and the like, higher in hardness and brittle, and hence it is difficult to improve the polishing rate; however, the polishing composition of the present embodiment can polish these hard-brittle material substrates at a relatively high polishing rate.

In particular, examples of the suitable polishing object of the polishing composition of the present embodiment include sapphire substrates. The sapphire substrate causes a solid-phase reaction with silica, and accordingly, the polishing performance tends to be affected by the specific surface area of silica and the state of the surface of the silica grains. Accordingly, the polishing performance can be improved by the polishing composition of the present embodiment.

The polishing composition of the present embodiment has a relatively high polishing rate for polishing objects having relatively high hardness such as the hard-brittle material substrates, and accordingly can polish in a short time even polishing objects having hitherto taken a long time to polish.

Accordingly, the improvement of the production efficiency and the reduction of the production cost can also be achieved.

Next, the polishing method of the present embodiment is described.

The polishing method of the present embodiment is a method for polishing a polishing object using such a polishing composition as described above.

(D) Polishing Method

Examples of the method for polishing a polishing object using such a polishing composition of the present embodiment as described above include, but not particularly limited to, the following method.

The polishing using the polishing composition of the present embodiment can use an apparatus and the polishing conditions used for the polishing of usual substrates and the like. As a polishing apparatus, for example, a single sided polishing apparatus or a double sided polishing apparatus can be used.

A polishing pad is not particularly limited, and any type of polishing pad such as a polyurethane type, a non-woven fabric type or a suede type polishing pad may be used as a polishing pad.

The polishing conditions can be appropriately set according to the polishing object. When a hard-brittle material substrate is polished as a polishing object, the following polishing conditions are preferable, for example.

Examples of the polishing load include: 50 g or more and 1000 g or less, and preferably 100 g or more and 800 g or less per 1 cm$^2$ area of the polishing object.

Examples of the linear polishing rate include: 10 m/min or more and 300 m/min or less and preferably 30 m/min or more and 200 m/min or less.

When the polishing load and the linear polishing rate fall within the above-described ranges, the friction against the polishing object can be regulated so as to fall within an appropriate range.

The polishing composition of the present embodiment can sufficiently improve the polishing rate even when the polishing load and the linear polishing rate fall within the above-described ranges. Accordingly, polishing is performed using the polishing composition of the present embodiment with the above-described polishing load and the above-described linear polishing rate, the damage to the polishing object can be suppressed while the polishing rate is being maintained at a relatively high value.

Moreover, the polishing method of the present embodiment may polish a polishing object in such a way that such a polishing composition as described above is used once or more, then recovered and used again to polish the polishing object.

The polishing composition of the present embodiment can polish a polishing object at a relatively high polishing rate as described above, and can maintain the polishing rate over a long time as described above. Accordingly, for example, even when the polishing composition of the present embodiment is used once or more for polishing a polishing object, then recovered, and used again for polishing a polishing object, the polishing composition of the present embodiment can maintain the polishing rate.

When the polishing composition used once or more is used again as described above, examples of the reuse of the recovered polishing composition include a case where the polishing composition after use is recovered, once placed in a tank or the like, and further supplied to a polishing apparatus or the like.

Alternatively, examples of the reuse of the recovered polishing composition include a cyclic use method in which polishing is performed while the polishing composition is being supplied at a constant supply rate to a polishing apparatus, at the same time the polishing composition is recovered with a recovery unit such as a drain and placed in a tank or the like, the recovered polishing composition is subjected to a filtration step or the like if necessary, and then the polishing composition placed in a tank or the like is again supplied to the polishing apparatus using a pump or the like.

When the polishing composition of the present embodiment is reused, silica may be supplemented. When silica is supplemented, a silica having a BET specific surface area and an NMR specific surface area falling within the above described ranges may be supplemented, or alternatively a silica other than the foregoing silica may be supplemented.

When the polishing composition of the present embodiment is reused, the components of the polishing composition other than silica may also be supplemented.

As described above, the polishing composition of the present embodiment is a polishing composition including water and silica; the BET specific surface area of the silica is 30 m$^2$/g or more and the NMR specific surface area of the silica is 10 m$^2$/g or more; thus, the polishing composition has a relatively high polishing rate for a polishing object having a relatively high hardness such as a hard-brittle material substrate, and can maintain the polishing rate over a long term.

Also, as described above, the polishing method of the present embodiment is a method for polishing a polishing object using the above-described polishing composition, and hence has a relatively high polishing rate for a polishing object having a relatively high hardness such as a hard-brittle material substrate, and can maintain the polishing rate over a long term.

The polishing composition and the polishing method according to the present embodiment are as described above, but it should be construed that the embodiments disclosed are presented in all aspects as exemplification and are not restrictive. The scope of the present invention is defined not by the foregoing description but by the appended claims, and is intended to include all the modifications in the meaning of equivalence to the claims and within the scope of the present invention.

The present inventors made a diligent study in order to solve such problems as described above, and consequently have achieved the present invention by discovering that the polishing rate of the polishing composition can be improved and the polishing rate can be maintained over a long term by using silica having a particular specific surface area as the abrasive grain.

According to the present invention, the polishing composition is a polishing composition including water and silica, and the silica has a BET specific surface area of 30 m$^2$/g or more and an NMR specific surface area of 10 m$^2$/g or more; thus, the polishing composition can improve the polishing rate for a polishing object, and can maintain the polishing rate even when used over a long term.

When the pH of the polishing composition falls within the above-described range, the polishing rate for a polishing object can be further improved, and the polishing rate can be more maintained even when the polishing composition is used over a long term.

The polishing method according to the present invention polishes a polishing object using the above-described polishing composition. The polishing method according to the present invention may polish a polishing object in such a way that the polishing composition is used once or more, then recovered and used again to polish the polishing object.

Even when polishing is performed by using again the polishing composition recovered after used once or more, while the polishing rate is being maintained, polishing can be performed at a relatively high polishing rate.

Even when a hard-brittle material having a relatively high hardness is polished by the polishing method of the present invention, polishing can be performed at a relatively high polishing rate while the polishing rate is being maintained.

As described above, according to the present invention, it is possible to provide a polishing composition capable of maintaining the polishing rate so as to be high and over a long term.

Also, according to the present invention, it is possible to provide a polishing method capable of polishing at a relatively high polishing rate, and capable of maintaining the polishing rate over a long term.

EXAMPLES

Hereinafter, Examples of the present invention are described; however, the present invention is not limited to these Examples.

((Measurement of Specific Surface Area))

Six types of colloidal silica were prepared, and the BET specific surface area and the NMR specific surface area of each of the six types of colloidal silica were measured.

(BET Specific Surface Area)

The BET specific surface area was measured by the following method.

Each slurry was dried in an oven set at 185° C. for 30 minutes, then the residual silica was crushed in a mortar to prepare a powder form sample; the specific surface area was measured with a BET specific surface area measurement apparatus (trade name: SA-3100, manufactured by Beckman Coulter, Inc.) using 0.3 g of the powder form sample; the results thus obtained are shown in Table 1.

(NMR Specific Surface Area)

The NMR specific surface area was measured by the following method.

Each of the silicas was dispersed in water so as to have the concentration shown in Table 1, and thus a slurry was prepared as a sample. The specific surface area of each of the samples was measured using as the measurement apparatus a pulsed NMR Particle Interface Characteristic Evaluation Apparatus (Acorn area, purchased from Nihon Rufuto Co., Ltd.) under the following measurement conditions, and the results thus obtained are shown in Table 1.

<Measurement Conditions>

Bulk relaxation time: 2699 ms

Specific surface relaxivity: 0.00026

Volume ratio of particle to liquid; Calculated from the concentration of silica and the silica grain density (fixed at 2.2 g/cm$^3$) in each slurry, and the blank solution density (fixed at 1.0 g/cm$^3$)

TABLE 1

| Silica No. | Abrasive grain concentration wt % | BET specific surface area (m$^2$/g) | NMR specific surface area (m$^2$/g) |
|---|---|---|---|
| 1 | 37.5 | 35 | 22.5 |
| 2 | 40.4 | 65 | 11.2 |
| 3 | 40.6 | 63 | 14.9 |
| 4 | 37.8 | 84 | 25.6 |
| 5 | 37.5 | 35 | 9 |
| 6 | 40.5 | 29 | 10.4 |

((Polishing Composition))

By using the silicas shown in Table 1, the polishing compositions of Examples and Comparative Examples were prepared.

Samples were prepared by mixing silica, water and NaOH for pH regulation so as to have the silica concentrations and the pH values described in Table 1 and Table 2.

((Measurement of Polishing Rate))

The polishing rate was measured using each of the polishing compositions.

The polishing conditions of one batch polishing were as follows; under the same conditions, polishing was performed up to three batches.

<Polishing Conditions>

Polisher: 36GPAW manufactured by SpeedFAM Co., Ltd.

Load: 350 g/cm$^2$

Platen rotation number: 40 rpm

Polishing head: Four axes

Polishing object: Sapphire wafer, 4-inch C-plane

Number of wafers: 24 (6/plate×4)

Polishing time: 150 min/batch

Slurry flow rate: 3.6 L/min

Recycled slurry amount: 18 kg

The polishing rate was measured by the following method.

The wafer thickness variation magnitudes at the five points (one point at the center, four points in the outer peripheral portion) on a sapphire wafer from before to after the polishing were measured using the GT2-A12K manufactured by Keyence Corp.; the average value of the variation magnitudes of the five points was divided by the polishing time to calculate the polishing magnitude per unit time.

((Variation Rate of Polishing Rate))

The variation rate (%) of the polishing rate in the third batch of polishing in relation to the polishing rate in the first batch of polishing in each of the polishing compositions is shown in Table 2.

The polishing was performed up to the fifth batch of polishing using each of the polishing compositions of Examples 2 and 3, and the variation rate (%) of the polishing rate in the fifth batch of polishing in relation to the polishing rate in the first batch of polishing was obtained as shown in Table 3.

TABLE 2

|  | Silica No. | BET specific surface area (m²/g) | NMR specific surface area (m²/g) | First batch µm/hr | Second batch µm/hr | Third batch µm/hr | Variation rate of polishing rate Third batch/first batch | pH |
|---|---|---|---|---|---|---|---|---|
| Example 1 | 1 | 35 | 22.5 | 1.9 | 2.1 | 1.9 | 0% | 9.3 |
| Example 2 | 2 | 65 | 11.2 | 2.5 | 2.5 | 2.4 | 4% | 10 |
| Example 3 | 3 | 63 | 14.9 | 2.9 | 2.8 | 2.9 | 0% | 9.6 |
| Example 4 | 4 | 84 | 25.6 | 3.1 | 3.2 | 3.1 | 0% | 9.6 |
| Comparative Example 1 | 5 | 35 | 9 | 2.1 | 1.9 | 1.5 | 29% | 9.3 |
| Comparative Example 2 | 6 | 29 | 10.4 | 1.8 | 1.8 | 1.8 | 0% | 10.1 |

TABLE 3

|  | BET specific surface area (m²/g) | NMR specific surface area (m²/g) | First batch µm/hr | Second batch µm/hr | Third batch µm/hr | Fourth batch µm/hr | Fifth batch µm/hr | Variation rate of polishing rate Fifth batch/first batch |
|---|---|---|---|---|---|---|---|---|
| Example 2 | 65 | 11.2 | 2.5 | 2.5 | 2.4 | 2 | 1.4 | 43% |
| Example 3 | 63 | 14.9 | 2.9 | 2.8 | 2.9 | 2.6 | 2.4 | 18% |

As can be seen from Table 2, in each Example using a silica having a BET specific surface area of 30 m²/g or more and an NMR specific surface area of 10 m²/g or more, the polishing rate was relatively high, and the variation rate of the polishing rate in the third batch of polishing in relation to the polishing rate in the first batch of polishing was small.

In Comparative Example 1 using a silica having a small NMR specific surface area, although the polishing rate in the first batch of polishing was relatively high, the variation rate of the polishing rate in the third batch of polishing was large; namely, the polishing rate was not able to be maintained.

In Comparative Example 2 using a silica having a small BET specific surface area, the polishing rate was smaller from the first batch of polishing as compared with Examples.

As can be seen from Table 3, the polishing composition of Example 3 having almost the same BET specific surface area as the BET specific surface area of the polishing composition of Example 2, but having a larger NMR specific surface area than the polishing composition of Example 2 is smaller in the variation rate of the polishing rate as compared with the polishing composition of Example 2; namely, the polishing composition of Example 3 was able to maintain the polishing rate over a longer term.

((Relationship between BET Specific Surface Area and Polishing Rate))

From the above-described results, the curve showing the relationship between the BET specific surface area on the abscissa and the polishing rate (in the first batch of polishing) on the ordinate is shown in FIG. 1.

As can be seen from FIG. 1, the BET specific surface area giving a polishing rate of 2.0 µm or more falls within a range of 35 m²/g or more and 140 m²/g or less.

The invention claimed is:

1. A polishing composition comprising:
water and abrasive grain,
wherein the abrasive grain consists of colloidal silica, and the colloidal silica has a BET specific surface area of 35 m²/g or more and 140 m²/g or less and an NMR specific surface area of 11.2 m²/g or more and 25.6 m²/g or less.

2. The polishing composition of claim 1, further comprising a pH adjuster to regulate the pH in a range of 8.0 to 11.5.

3. A polishing method comprising:
supplying the polishing composition according to claim 1 to a polishing apparatus; and
polishing a polishing object with the polishing apparatus.

4. The polishing method according to claim 3, wherein the polishing composition has a pH of 8.0 or more and 11.5 or less.

5. A polishing method comprising:
supplying the polishing composition according to claim 2 to a polishing apparatus; and
polishing a polishing object with the polishing apparatus.

6. The polishing method according to claim 5, wherein the polishing composition is recovered after used once or more, and used again to polish a polishing object.

7. The polishing method according to claim 6, wherein the polishing object is a substrate including a material being higher in hardness than silicon wafers and being brittle compared with silicon wafers.

8. The polishing method according to claim 5, wherein the polishing object is a substrate including a material being higher in hardness than silicon wafers and being brittle compared with silicon wafers.

9. The polishing method according to claim 3, wherein the polishing composition is recovered after used once or more, and used again to polish a polishing object.

10. The polishing method according to claim 9, wherein the polishing object is a substrate including a material being higher in hardness than silicon wafers and being brittle compared with silicon wafers.

11. The polishing method according to claim 3, wherein the polishing object is a substrate including a material being higher in hardness than silicon wafers and being brittle compared with silicon wafers.

* * * * *